US010631392B2

(12) United States Patent
Wu et al.

(10) Patent No.: US 10,631,392 B2
(45) Date of Patent: Apr. 21, 2020

(54) EUV COLLECTOR CONTAMINATION PREVENTION

(71) Applicant: Taiwan Semiconductor Manufacturing Company, Ltd., Hsinchu (TW)

(72) Inventors: Ming-Fa Wu, Kaohsiung (TW); Tzung-Chi Fu, Miaoli (TW); Chun-Che Lin, Tainan (TW); Po-Chung Cheng, Zhongpu Shiang (TW); Huai-Tei Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/967,153

(22) Filed: Apr. 30, 2018

(65) Prior Publication Data

US 2019/0335571 A1 Oct. 31, 2019

(51) Int. Cl.
*H05G 2/00* (2006.01)

(52) U.S. Cl.
CPC ............. *H05G 2/006* (2013.01); *H05G 2/008* (2013.01)

(58) Field of Classification Search
CPC .......... H05G 2/00; H05G 2/003; H05G 2/005; H05G 2/006; H05G 2/008
See application file for complete search history.

(56) References Cited

U.S. PATENT DOCUMENTS

| | | | | |
|---|---|---|---|---|
| 6,493,423 | B1 * | 12/2002 | Bisschops | G03F 7/70033 378/119 |
| 6,661,018 | B1 * | 12/2003 | McGregor | G03F 7/70033 250/492.22 |
| 7,479,645 | B2 * | 1/2009 | Yabuta | B82Y 10/00 250/365 |
| 8,361,842 | B2 | 1/2013 | Yu et al. | |
| 8,507,882 | B2 * | 8/2013 | Swinkels | G03F 7/70033 250/504 R |
| 8,680,647 | B2 | 3/2014 | Yu et al. | |
| 8,703,542 | B2 | 4/2014 | Lin et al. | |
| 8,759,964 | B2 | 6/2014 | Pu et al. | |
| 8,778,738 | B1 | 7/2014 | Lin et al. | |
| 8,785,299 | B2 | 7/2014 | Mao et al. | |
| 8,796,666 | B1 | 8/2014 | Huang et al. | |
| 8,803,306 | B1 | 8/2014 | Yu et al. | |
| 8,809,996 | B2 | 8/2014 | Chen et al. | |
| 8,829,676 | B2 | 9/2014 | Yu et al. | |
| 8,877,554 | B2 | 11/2014 | Tsai et al. | |
| 9,012,132 | B2 | 4/2015 | Chang | |

(Continued)

OTHER PUBLICATIONS

"Around", Merriam-Webster, retrieved Jun. 3, 2019. (Year: 2019).*

*Primary Examiner* — Wyatt A Stoffa
(74) *Attorney, Agent, or Firm* — Slater Matsil, LLP

(57) ABSTRACT

An extreme ultra-violet (EUV) lithography system includes an EUV source and EUV scanner. A droplet generator provides a droplet stream in the EUV source. A gas shield is configured to surround the droplet stream. When a laser reacts a droplet in the stream, EUV radiation and ionized particles are produced. The gas shield can reduce contamination resulting from the ionized particles by conveying the ionized particles to a droplet catcher. Components of the EUV source may be biased with a voltage to repel or attract ionized particles to reduce contamination from the ionized particles.

20 Claims, 11 Drawing Sheets

(56) References Cited

U.S. PATENT DOCUMENTS

| | | | | |
|---|---|---|---|---|
| 9,028,915 | B2 | 5/2015 | Chang et al. | |
| 9,093,530 | B2 | 7/2015 | Huang et al. | |
| 9,146,469 | B2 | 9/2015 | Liu et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 2002/0162974 | A1* | 11/2002 | Orsini | H05G 2/003 250/504 R |
| 2003/0223546 | A1* | 12/2003 | McGregor | H05G 2/003 378/143 |
| 2004/0086080 | A1* | 5/2004 | Orsini | H05G 2/003 378/119 |
| 2006/0043319 | A1* | 3/2006 | Gaebel | H05G 2/003 250/504 R |
| 2006/0158126 | A1* | 7/2006 | Schuermann | G03F 7/70908 315/111.21 |
| 2006/0226377 | A1* | 10/2006 | Hergenhan | H05G 2/003 250/493.1 |
| 2008/0283779 | A1* | 11/2008 | Tran | G03F 7/70908 250/504 R |
| 2009/0230326 | A1* | 9/2009 | Vaschenko | H05G 2/003 250/492.2 |
| 2010/0258748 | A1* | 10/2010 | Vaschenko | H05G 2/003 250/504 R |
| 2011/0248191 | A1* | 10/2011 | Fomenkov | H05G 2/005 250/504 R |
| 2011/0291288 | A1 | 12/2011 | Wu et al. | |
| 2012/0085922 | A1* | 4/2012 | Yabu | H05G 2/008 250/432 R |
| 2012/0280149 | A1* | 11/2012 | Mestrom | H05G 2/001 250/492.1 |
| 2012/0305810 | A1* | 12/2012 | Ershov | G03F 7/70033 250/504 R |
| 2013/0026468 | A1 | 1/2013 | Yoshimuta et al. | |
| 2013/0062760 | A1 | 3/2013 | Hung et al. | |
| 2013/0062761 | A1 | 3/2013 | Lin et al. | |
| 2013/0168848 | A1 | 7/2013 | Lin et al. | |
| 2013/0307140 | A1 | 11/2013 | Huang et al. | |
| 2014/0078480 | A1* | 3/2014 | Park | G03F 7/20 355/67 |
| 2014/0203429 | A1 | 7/2014 | Yu et al. | |
| 2014/0225222 | A1 | 8/2014 | Yu et al. | |
| 2014/0252646 | A1 | 9/2014 | Hung et al. | |
| 2014/0264930 | A1 | 9/2014 | Yu et al. | |
| 2016/0227638 | A1* | 8/2016 | Hori | H05G 2/005 |
| 2016/0366756 | A1* | 12/2016 | Wu | H05G 2/005 |
| 2018/0027642 | A1* | 1/2018 | Ershov | H05G 2/006 250/504 R |
| 2018/0224748 | A1* | 8/2018 | Nagai | G21K 5/02 |

* cited by examiner

EUV COLLECTOR CONTAMINATION PREVENTION

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
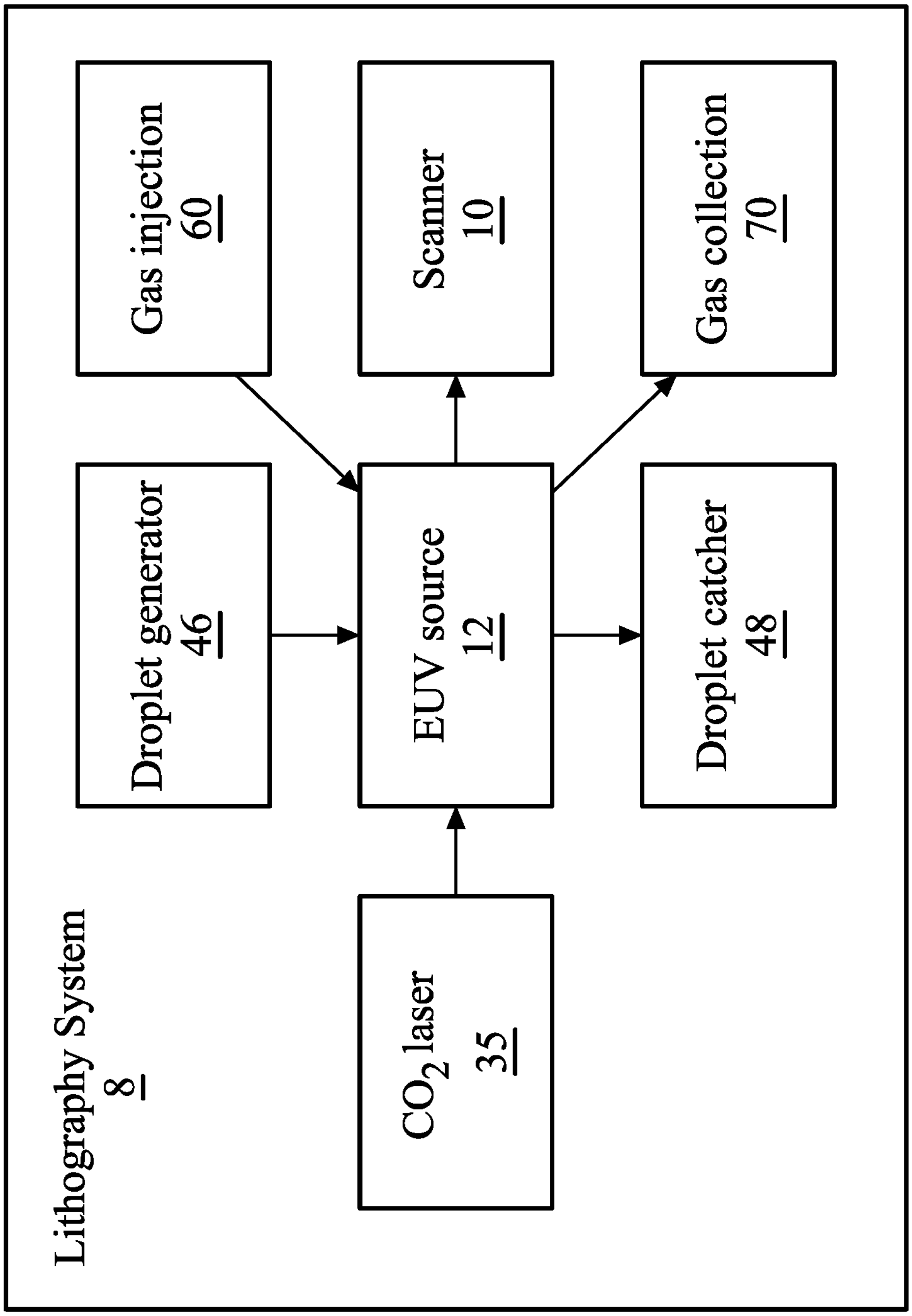
FIG. 1 is a block diagram of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present application reduce contamination of components of an EUV source when a vaporization reaction is performed to produce EUV radiation and positively charged particle byproducts. Embodiments may provide a gas shield around the reaction site so that particles are prevented from dispersing throughout the EUV source vessel. Embodiments may provide component biasing of the various components of the EUV source so that the charged particle byproducts are repelled from sensitive components and attracted to contaminant tolerant components where the particles may be recovered and reprocessed.

FIG. 1 is a block diagram of a lithography system 8, in accordance with some embodiments. In some embodiments, the lithography system 8 is an extreme ultraviolet (EUV) lithography system designed to expose a resist layer of a semiconductor wafer to EUV light. The resist layer is a material sensitive to the EUV light. The EUV lithography system 8 employs an EUV source 12 to generate EUV light, such as EUV light having a wavelength ranging between about 1 nm and about 100 nm, such as about 13.5 nm. In some embodiments, the EUV source 12 utilizes a mechanism of laser-produced plasma (LPP) to generate EUV radiation, which will be further described later.

The components of the lithography system 8 include a $CO_2$ laser system 35 for generating a high intensity laser pulse. The laser pulse is provided to the EUV source 12 system. A droplet generator 46 provides droplets of a material, such as tin, to the EUV source 12. When the laser pulse hits the droplet, EUV light will be produced and delivered to a scanner 10 which exposes the resist layer to a pattern of the EUV light. A droplet catcher 48 catches unreacted droplets for reprocessing. A gas injection system 60 and vacuum exhaust system 70 provide a flow of gas around the droplets to create a gas shield to direct ionized droplets to the droplet catcher 48.

Figure 2:
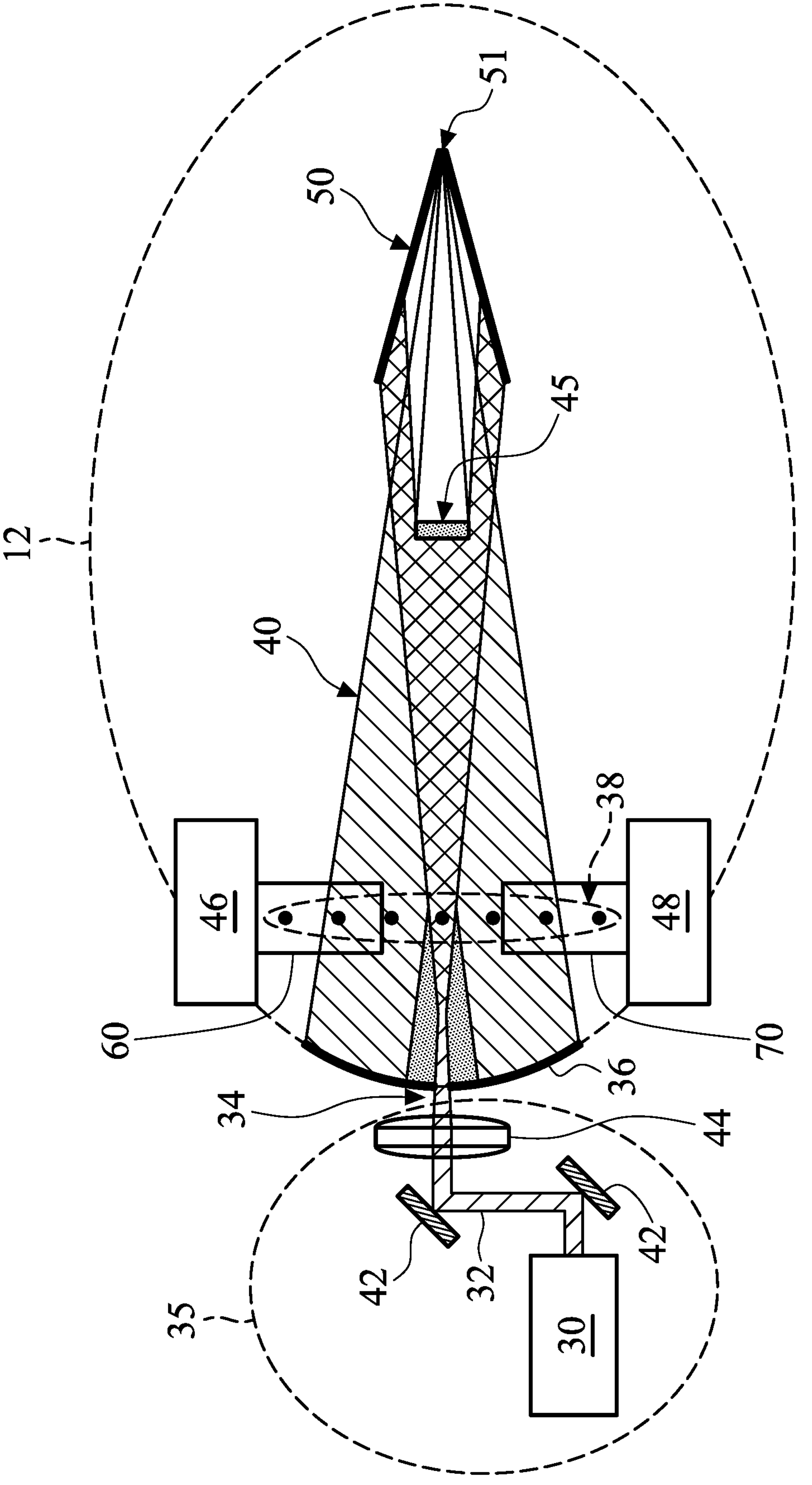
FIG. 2 illustrates an EUV source and $CO_2$ laser system, in accordance with some embodiments.

FIG. 2 illustrates EUV source 12 and $CO_2$ laser system 35, in accordance with some embodiments. $CO_2$ laser system 35 may include a pulse $CO_2$ laser 30 to generate laser beam 32. Laser beam 32 is directed by a beam delivery system 42, such as one or more mirrors configured to convey laser beam 32 to a focus lens 44 to focus laser beam 32. Laser beam 32 is then projected to EUV source 12. Although a $CO_2$ laser system is described, another laser system technology may be used as appropriate.

EUV source 12 includes window 34 to receive laser beam 32. Window 34 is located in a collector 36. The laser beam is directed through window 34 from the $CO_2$ laser system 35. Window 34 comprises a suitable material substantially transparent to laser beam 32.

Collector 36 is designed with a coating material and shape to function as a mirror for collecting EUV light and reflecting it to concentrate the reflected EUV light. In some embodiments, collector 36 is designed to have an ellipsoidal geometry. The outer diameter of collector 36 may be between about 400 mm and 600 mm, such as about 453.1 mm and window 34 may have a diameter of about 30 mm to about 150 mm, such as about 80.5 mm, for $CO_2$ laser system 35. Other sizes may be used for collector 36 and window 34. In some embodiments, the coating material of collector 36 may be similar to the reflective multilayer of an EUV mask (discussed below with respect to FIG. 3). For example, the coating material of collector 36 may include multiple reflective layers, such as a plurality of molybdenum-silicon film pairs (e.g., a layer of molybdenum above or below a layer of silicon in each film pair). Collector 36 may further include a capping layer (such as ruthenium) coated on the multiple reflective layers to substantially reflect the EUV light. In some embodiments, collector 36 may further include a grating structure designed to effectively scatter any of laser beam 32 which may reach the surface of collector 36. For example, a silicon nitride layer may be coated on collector 36 and may be patterned to have a grating pattern.

Droplets 38 are generated by a droplet generator 46. The selection of the material for the droplets may be made based on a desired wavelength of EUV light produced. In some embodiments droplets 38 are tin droplets and droplet generator 46 may be referred to as a tin droplet generator. Droplets 38 are shot across the front of collector 36 to a droplet catcher 48. Droplet catcher 48 is configured to catch the droplets 38, and may be referred to as a tin catcher. It should be understood that, although tin is discussed as being used as the material of the droplets, other materials can be used for the droplets, depending on what wavelength of light is desired to be produced by the creation of the LPP.

Laser beam 32 is focused and enters EUV source 12 through window 34 to the droplets 38. When laser beam 32 hits a droplet 38, high-temperature plasma is generated. The high-temperature plasma produces EUV radiation 40, which is collected by collector 36. Collector 36 reflects and focuses EUV radiation 40 for the lithography exposing processes.

EUV source 12 further includes a central obscuration 45 designed and configured to obscure laser beam 32. EUV source 12 also includes a lower cone 50 and intermediate focus (IF) module 51. Lower cone 50 may include a treated surface which further directs EUV radiation to the IF module 51. IF module 51 is configured to provide intermediate focus of the EUV radiation 40 to convey to scanner 10. IF module 51 may include, for example, an IF-cap quick-connect module.

Figure 3:
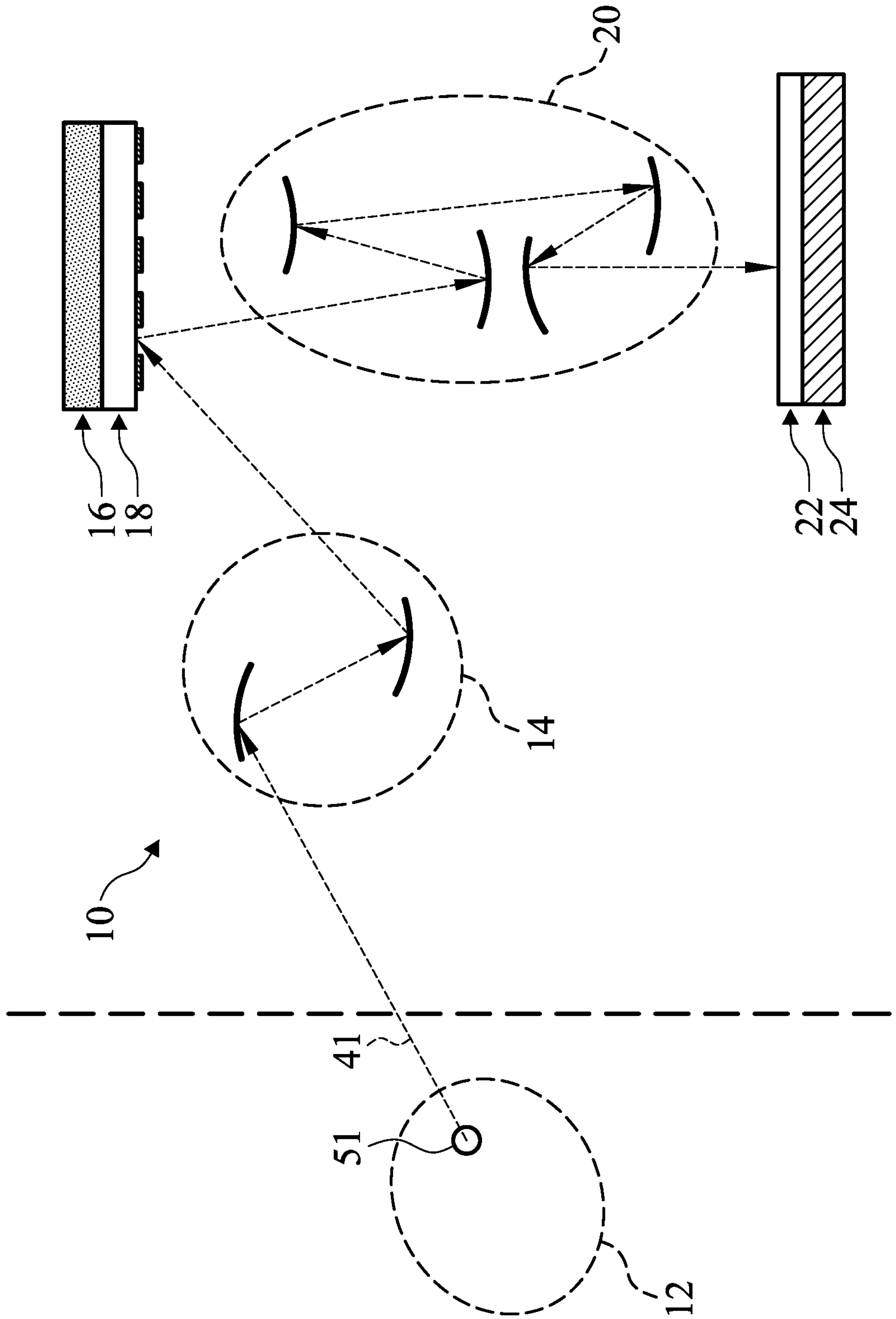
FIG. 3 illustrates a scanner, in accordance with some embodiments.

Turning now to FIG. 3, FIG. 3 illustrates scanner 10, in accordance with some embodiments. Scanner 10 receives EUV light 41 from IF module 51 and performs the photolithography. Scanner 10 of the lithography system employs an illuminator 14. In various embodiments, illuminator 14 includes various refractive optic components, such as a single lens or a lens system having multiple lenses (zone plates) or reflective optics (for EUV lithography system), such as a single mirror or a mirror system having multiple mirrors in order to direct EUV light 41 from EUV source 12 onto a mask stage 16, particularly to a mask 18 secured on the mask stage 16. In embodiments where EUV source 12 generates EUV light 41 in the EUV wavelength range, reflective optics may be employed.

In scanner 10 mask stage 16 is configured to secure a mask 18. In some embodiments, mask stage 16 includes an electrostatic chuck (e-chuck) to secure mask 18. Because gas molecules absorb EUV light, scanner 10 is maintained in a vacuum environment to reduce EUV light intensity loss. In the disclosure, the terms of mask, photomask, and reticle are used to refer to the same item. Mask 18 includes a substrate with a suitable material, such as a low thermal expansion material (LTEM) or fused quartz. The LTEM may include $TiO_2$ doped $SiO_2$, or other suitable materials with low thermal expansion. Mask 18 includes a multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). In some embodiments, the ML may include molybdenum-beryllium (Mo/Be) film pairs, or other suitable materials that are configurable to highly reflect the EUV light. Mask 18 may further include a capping layer, such as ruthenium (Ru), disposed on the ML for protection. Mask 18 further includes an absorption layer, such as a tantalum boron nitride (TaBN) layer, deposited over the ML. The absorption layer is patterned to define a pattern of a layer of an integrated circuit (IC). Alternatively, another reflective layer may be deposited over the ML and is patterned to define a pattern of layer of an integrated circuit, thereby forming an EUV phase shift mask.

Scanner 10 also includes a projection optics module, projection optics box (POB) 20, for imaging the pattern of the mask 18 on to a semiconductor substrate 22 secured on a substrate stage 24 of the lithography system 8. The POB 20 may have refractive optics (such as for UV lithography system) or reflective optics (such as for EUV lithography system) in various embodiments. The light directed from mask 18, carrying the image of the pattern defined on the mask, is collected by the POB 20. The illuminator 14 and the POB 20 are collectively referred to an optical module of scanner 10.

Scanner 10 also includes a substrate stage 24 to secure a semiconductor substrate 22. Semiconductor substrate 22 may be, for example, a semiconductor wafer, such as a silicon wafer or other type of wafer to be patterned. The semiconductor substrate 22 is coated with the resist layer sensitive to EUV light. Various components including those described above are integrated together and are operable to perform lithography exposing processes.

Figure 4:
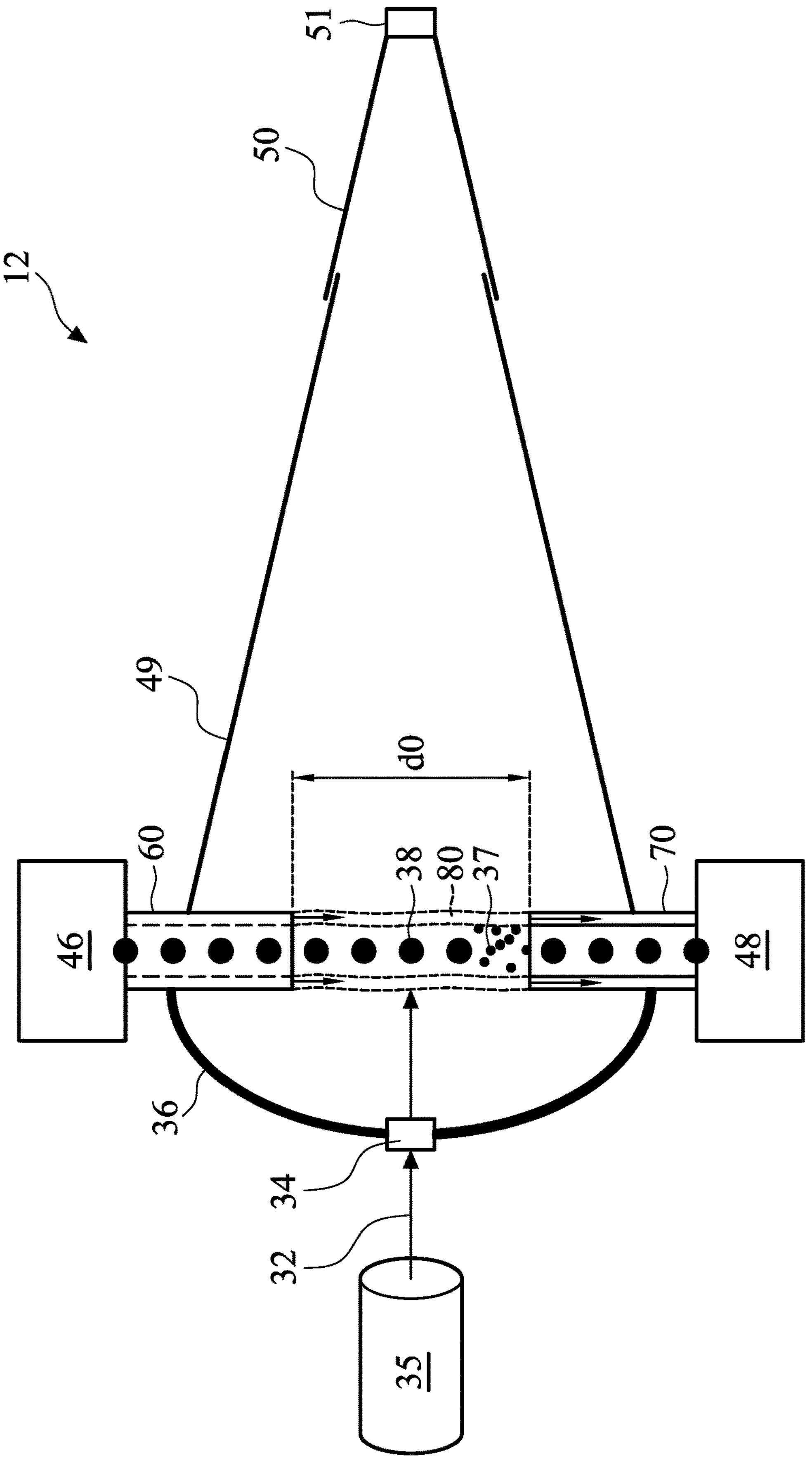
FIG. 4 illustrates a gas injection system and vacuum exhaust system configured to form a gas shield, in accordance with some embodiments.

Turning now to FIG. 4, FIG. 4 illustrates a gas injection system and vacuum exhaust system configured to form a gas shield 80, in accordance with some embodiments. The illustration of FIG. 4 shows a different view of the EUV source 12 with more detail provided for the gas injection system 60 and vacuum exhaust system 70.

EUV source 12 includes an enclosed chamber (referred to as a source vessel) to generate the LPP within. The components of the source vessel include collector 36, window 34, vanes 49, lower cone 50, and IF module 51. A vacuum is maintained in the source vessel since air would absorb EUV radiation 40. Laser beam 32 pulses from $CO_2$ laser system 35 are synchronized to enter through window 34 to hit a droplet 38 when positioned in the path of the laser beam 32 pulse to receive peak power from $CO_2$ laser system 35. When the laser beam 32 pulses hit the tin droplet, the droplet is vaporized to create LPP, resulting in EUV radiation and positive ion particles 37. EUV radiation collected by collector 36 and transmitted to the intermediate focus 51, as described above. As a result of the vaporization, however, without mitigation positive ion particles 37 would be homogeneously scattered in the EUV source chamber. The reaction creating the LPP is similar to an explosion where particles are distributed in all directions.

Unreacted tin droplets pass to droplet catcher 48. For tin droplets which are vaporized, without mitigation the vaporized tin would be homogeneously distributed on the inside of the source vessel, including on collector 36, window 34, vanes 49, and lower cone 50, as well as exposed surfaces of other components of the source vessel. Tin contaminates on window 34, collector 36, and lower cone 50 reduce the effectiveness of the EUV source 12. While some of these components are replaceable, collector 36 is highly precise and expensive to produce, so contamination on collector 36 is undesirable. Some components can be recovered. For example, in the case of vanes 49, vanes 49 may be heated to melt and recover material, such as tin, that collects on vanes 49.

To reduce contamination of the components of the source vessel, gas shield 80 is produced around the stream of droplets 38. When the LPP is produced, EUV radiation 40 passes through the gas shield unimpeded, but the vaporized tin is kept within gas shield 80 and directed toward droplet catcher 48.

Still referring to FIG. 4, gas shield 80 is produced by a gas injection system 60 including a gas injection tube which is placed around the outlet of droplet generator 46 and a corresponding vacuum exhaust system 70 including a vacuum exhaust tube placed around the inlet of droplet catcher 48. Gas is produced at the outlet of the gas injection tube and collected at the inlet of the vacuum exhaust tube. The flow of gas shield 80 may be controllable to produce a greater or lesser gas shield. The distance d0 between the outlet of the gas injection tube of gas injection system 60 and the inlet of the vacuum exhaust tube of vacuum exhaust system 70 may be between about 0.1 mm and 400 mm, such as about 10 mm. Other values may be used, depending on design.

Figure 6:
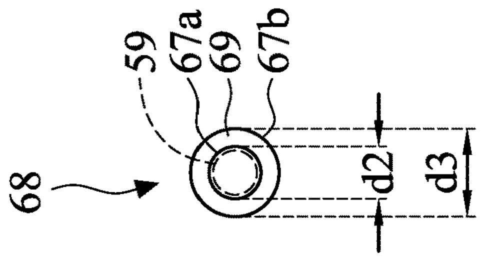
FIG. 6 illustrates a cross-sectional view of a gas injection tube, in accordance with some embodiments.
Figure 5:
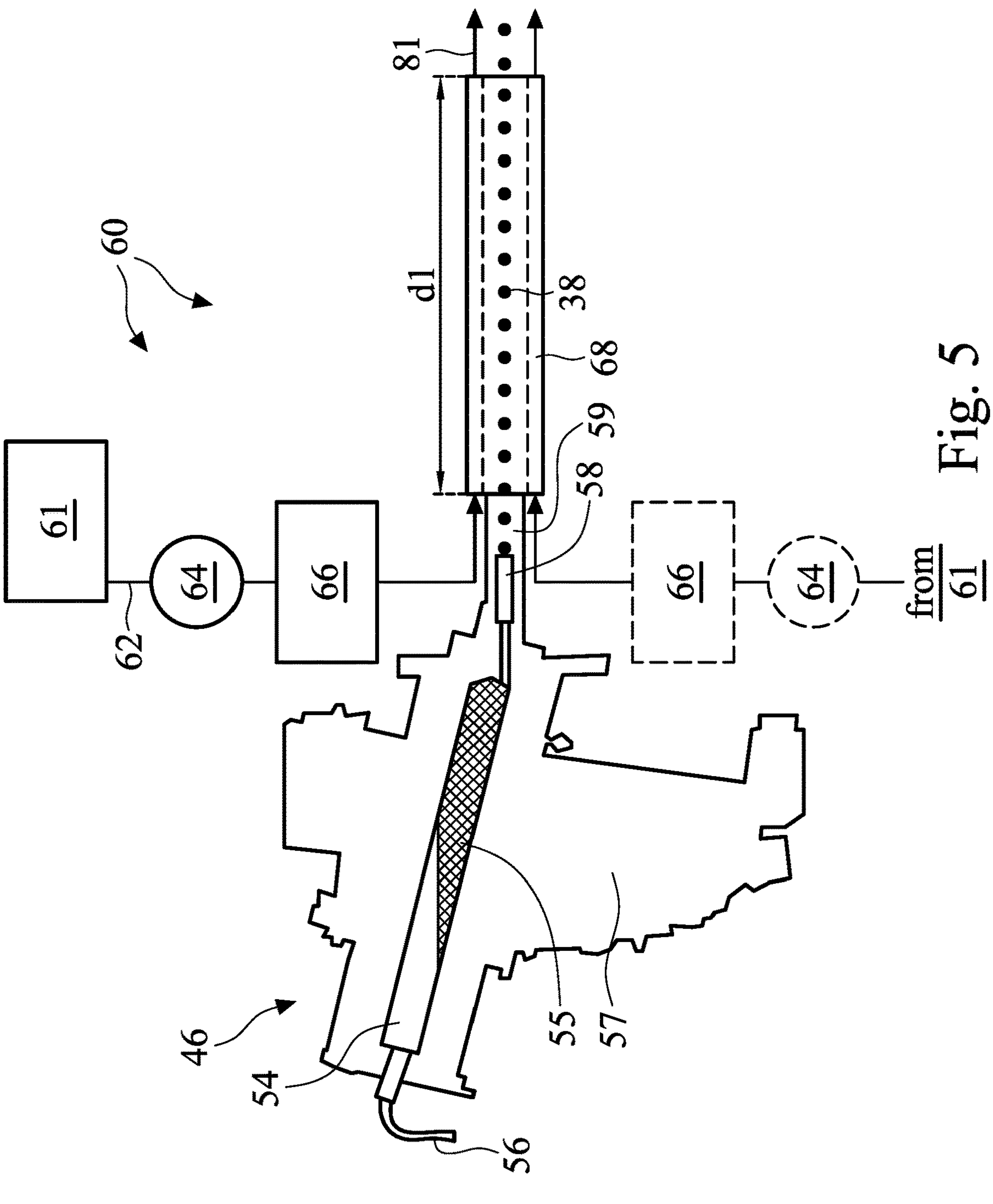
FIG. 5 illustrates a droplet generator and gas injection system, in accordance with some embodiments.

Turning now to FIG. 5 and FIG. 6, in FIG. 5 droplet generator 46 and gas injection system 60 are illustrated in accordance with some embodiments. In FIG. 6, a cross-sectional view of a gas injection tube 68 is illustrated in accordance with some embodiments. In FIG. 5, droplet generator 46 may include reservoir 54, with melted purified tin 55 (or other suitable material) therein, a gas supply line 56 for supplying a propulsion gas, such as argon, a steering system 57 for controlling droplet generation, a piezo actuator 58 for generating droplets using sonic vibrations, and a nozzle-shroud 59 which droplets 38 are produced out of and shrouded as they enter into the source vessel. Droplet generator 46 may be oriented as illustrated and produce a horizontal stream of droplets 38. The size of droplets can vary by design and may have a diameter between about 10 μm and 60 μm, such as about 27 μm. Other sizes for the droplets may be used. Droplets may be formed at a frequency between about 10 kHz and 100 kHz, such as about 50 kHz. Other droplet frequencies may also be used.

Gas injection system 60 may include a gas source 61, gas line 62, pressure regulator 64, mass flow meter or mass flow controller 66, and gas injection tube 68. The gas provided by gas source 61 may include any suitable gas, such as $H_2$, He, Ar, $N_2$, $O_2$, $N_2O$, clean dry air (CDA), ambient air, or combinations thereof. Other suitable gases may also be used. Arrows on the gas line 62 indicate the direction of flow. Pressure regulator 64 can regulate the pressure of the gas to the mass flow meter or mass flow controller 66. Mass flow meter or mass flow controller 66 can regulate the quantity of volume of gas provided to gas injection tube 68 to control the flow of gas. Flow of gas can be set to any suitable value, such as about 10 sccm to about 10,000 sccm, such as about 2,000 sccm. Gas injection tube 68 receives the regulated gas and injects the gas through the tube and into the source vessel. The outlet of gas injection tube 68 surrounds the nozzle-shroud 59 of droplet generator 46 so that the outlet of gas injection tube circumscribes the stream of droplets from droplet generator 46.

As shown in FIG. 5, in some embodiments, gas injection system 60 can include multiple pressure regulators 64 and multiple mass flow meters or mass flow controllers 66. Gas injection tube 68 may be attached to nozzle-shroud 59 of droplet generator 46 so that part of nozzle-shroud 59 is disposed within a portion of gas injection tube 68. In some embodiments, nozzle-shroud 59 may traverse the entire length of gas injection tube 68. In some embodiments, nozzle-shroud 59 may extend beyond the end of gas injection tube 68. The length of gas injection tube 68 may be varied depending on the application. The length d1 of gas injection tube 68 may be between about 0.1 mm and 500 mm, such as about 200 mm. Other dimensions may be used as appropriate.

Referring to FIG. 6, a cross-sectional view of gas injection tube 68 of FIG. 5 is illustrated, in accordance with some embodiments. Gas injection tube 68 has an inner wall 67*a* and outer wall 67*b*. Gas flows through the cavity 69 between inner wall 67*a* and outer wall 67*b*. Nozzle-shroud 59 is shown in phantom, which may or may not be in the cross-section, and is illustrated for context. The diameter d2 of inner wall 67*a* may be between about 0.1 mm and 100 mm, such as about 10 mm, depending on the design and requirements. The diameter d3 of outer wall 67*b* may be between about 0.1 mm and 100 mm, such as about 12 mm, depending on the design and requirements. Other dimensions may be used as appropriate.

Gas injection tube 68 may be made of any suitable material, such as quartz, aluminum, stainless steel, ceramic, copper, or an aluminum alloy. Gas injection tube 68 may be heated by a heating element (not shown) to prevent vaporized droplet material from coating it. Gas injection tube 68, for example, may be heated to between about 50° C. and 450° C., such as about 250° C. Other temperatures may be used, for example, temperatures greater than the melting point of the droplet material, such as greater than 232° C. when the droplet material is tin. In addition, a proportional integral derivative (PID) controller (not shown) may be used to control the temperature of gas injection tube 68 and receive temperature feedback from gas injection tube 68. Referring back to FIG. 5, in some embodiments, gas injection tube 68 may be tilted upwards by up to about 5 degrees, such as 2 degrees, so that if droplet material condenses or otherwise forms on gas injection tube 68, the material can flow back into reservoir 54.

Figure 7:
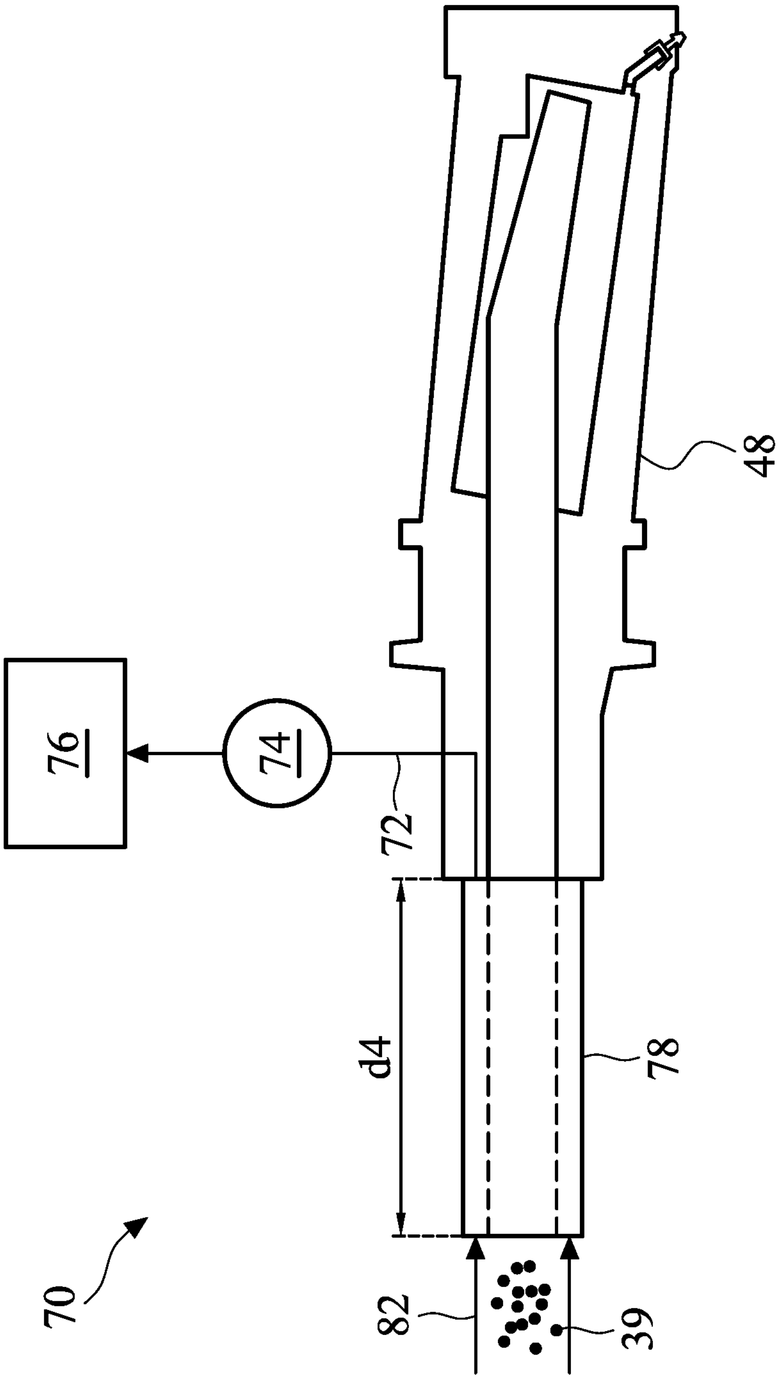
FIG. 7 illustrates a droplet catcher and vacuum exhaust system, in accordance with some embodiments.

Turning to FIG. 7, droplet catcher 48 and vacuum exhaust system 70 are illustrated, in accordance with some embodiments. Droplet catcher 48 catches droplets 38 which are generated by droplet generator 46 but not vaporized by a laser beam 32 pulse from $CO_2$ laser system 35. Vacuum exhaust system 70 may be attached in front of the opening of droplet catcher 48 such that the droplets 38 pass through a vacuum exhaust tube 78. The end of vacuum exhaust tube closest to droplet catcher 48 is coupled to a vacuum line 72 and routed to a throttle valve or pressure control valve 74 and then to negative pressure source 76. Negative pressure source 76 may include a vacuum pump or another suitable device for providing a suitable negative pressure. For example, some embodiments may use an Edwards high vacuum iXH dry pumps or an Ebara dry vacuum pump Model EV-M series. Other suitable pumps may be used. In some embodiments the pressure control provided by throttle valve or pressure control valve 74 may be between about 0.1 Pa to about 900 Pa, such as about 5 Pa. Other values may be used based on the design and operation of gas injection system 60. For example, suitable pressure may be applied by vacuum exhaust system 70 to offset the volume of gas provided by gas injection system 60. In some embodiments, vacuum exhaust pressure may be dynamically controllable based on feedback from the source chamber. In some embodiments, recovered gas by vacuum exhaust system 70 may be looped to gas source 61.

Vacuum exhaust tube 78 is aligned with gas injection tube 68. Gas 82 (see FIG. 5) provided at the outlet of gas injection tube 68 flows across the face of collector 36 (see FIG. 4) into the inlet of vacuum exhaust tube 78 and forms a gas shield 80 surrounding droplets 38. When droplets 38 are vaporized by CO2 laser system 35, ionized particles 39 of the droplet material are created. Whereas particles 39 would be homogeneously scattered in the source vessel without a gas shield, gas shield 80 maintains particles 39 within the gas shield and the flow of gas shield 80 conveys or directs particles 39 to droplet catcher 48.

Vacuum exhaust tube 78 may be made of any suitable material, such as quartz, aluminum, stainless steel, ceramic, copper, or an aluminum alloy. Vacuum exhaust tube 78 may be made of a same or different material than gas injection tube 68. Vacuum exhaust tube 78 may be heated by a heating element (not shown) to prevent vaporized droplet material from coating it. Vacuum exhaust tube 78, for example, may be heated to between about 50° C. and 450° C., such as about 250° C. Other temperatures may be used, for example, temperatures greater than the melting point of the droplet material, such as greater than 232° C. when the droplet material is tin. In addition, a proportional integral derivative (PID) controller (not shown) may be used to control the temperature of vacuum exhaust tube 78 and receive temperature feedback from vacuum exhaust tube 78. Referring back to FIG. 7, in some embodiments, vacuum exhaust tube 78 may be tilted upwards by up to about 5 degrees, such as 2 degrees, so that if droplet material condenses or otherwise forms on vacuum exhaust tube 78, the material can flow back into droplet catcher 48.

In some embodiments, vacuum exhaust system 70 can include multiple throttle valves or pressure control valves 74. The length of vacuum exhaust tube 78 may be varied depending on the application. The length d4 of vacuum exhaust tube 78 may be between about 0.1 mm and 500 mm, such as about 200 mm. Other dimensions may be used as appropriate.

Figure 8:
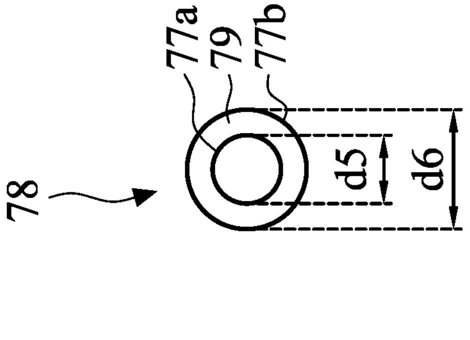
FIG. 8 illustrates a cross-sectional view of a vacuum exhaust tube, in accordance with some embodiments.

Referring to FIG. 8, a cross-sectional view of vacuum exhaust tube 78 of FIG. 7 is illustrated, in accordance with some embodiments. Vacuum exhaust tube 78 has an inner wall **77*a* and outer wall 77*b*. Gas flows through the cavity 79 between inner wall 77*a* and outer wall 77*b*. The diameter d5 of inner wall 77*a* may be between about 0.1 mm and 100 mm, such as about 10 mm, depending on the design and requirements. The diameter d6 of outer wall 77*b* may be between about 0.1 mm and 100 mm, such as about 15 mm, depending on the design and requirements. Other dimensions may be used as appropriate. The cross-sectional dimensions of gas injection tube 68 and vacuum exhaust tube 78 may be the same or similar to each other in some embodiments. In some embodiments, the cross-sectional dimensions of gas injection tube 68 and vacuum exhaust tube 78 may be different from each other. The cross-sectional dimensions of gas injection tube 68 and vacuum exhaust tube 78 are selectable to control the size of the gas shield 80 generated by gas injection system 60 and vacuum exhaust system 70**.

Figure 9A:
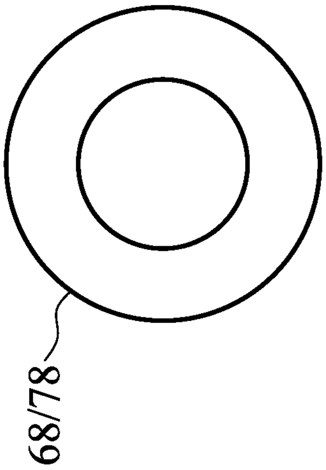
FIGS. 9*a*-9*d* illustrate various configurations for a gas injection tube and a vacuum exhaust tube, in accordance with some embodiments.
Figure 9B:
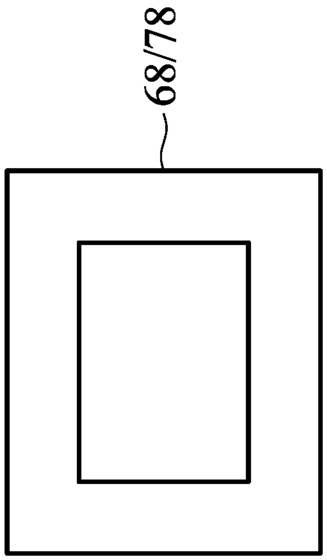
Figure 9C:
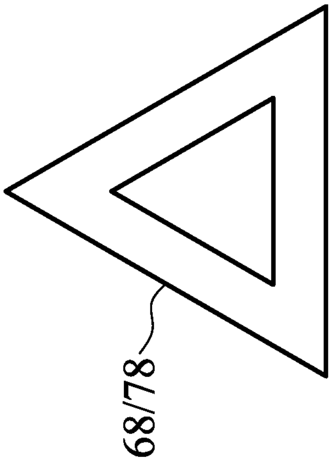
Figure 9D:
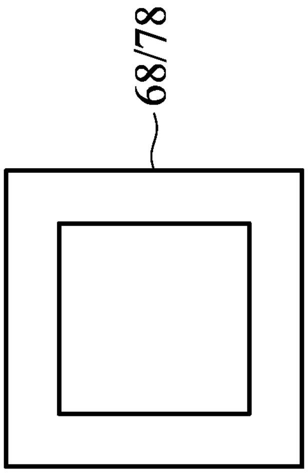

FIGS. **9*a*-9*d* illustrate various configurations for gas injection tube 68 and vacuum exhaust tube 78, in accordance with some embodiments. FIG. 9*a* illustrates a cross-sectional view of gas injection tube 68 or vacuum exhaust tube 78 as being circular. FIG. 9*b* illustrates a cross-sectional view of gas injection tube 68 or vacuum exhaust tube 78 as being rectangular. FIG. 9*c* illustrates a cross-sectional view of gas injection tube 68 or vacuum exhaust tube 78 as being triangular. FIG. 9*d* illustrates a cross-sectional view of gas injection tube 68 or vacuum exhaust tube 78 as being square. Other shapes for the cross-section may be used, such as other polygons, quadrilaterals, ellipses, and so forth. The shape of the gas injection tube 68 and vacuum exhaust tube 78 cross-sections may be the same as each other's or different. The edge dimensions of each of the illustrated embodiments in FIGS. 9*a*-9*d* may be similar to those discussed above with respect to the dimensions in FIG. 6 and FIG. 8**.

Figure 10:
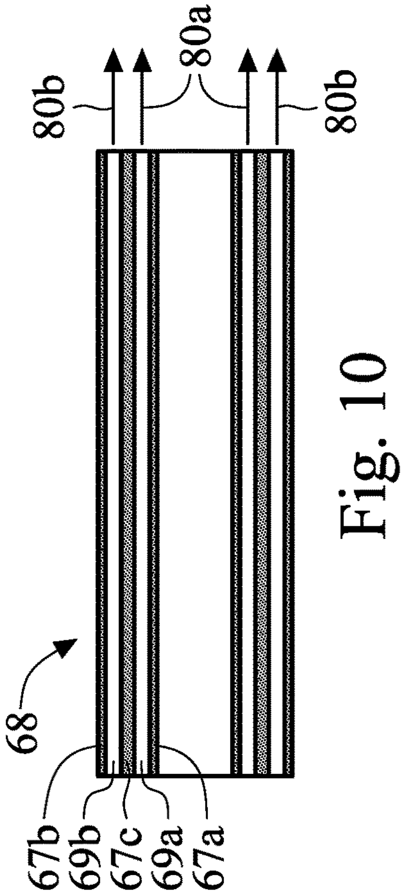
FIG. 10 illustrates a longitudinal cross-section of a gas injection tube having a double cavity, in accordance with some embodiments.

FIG. 10 illustrates a longitudinal cross-section of a gas injection tube 68 having a double cavity, in accordance with some embodiments. In some embodiments, multiple concentric cavities may be used to provide multiple layered gas shields. In FIG. 10, for example, two adjacent cavities are illustrated. The first cavity **69*a* is between inner wall 67*a* and middle wall 67*c*. The second cavity 69*b* is between middle wall 67*c* and outer wall 67*b***. Although two cavities are shown, it should be understood that other numbers of cavities may be present.

Figure 13:
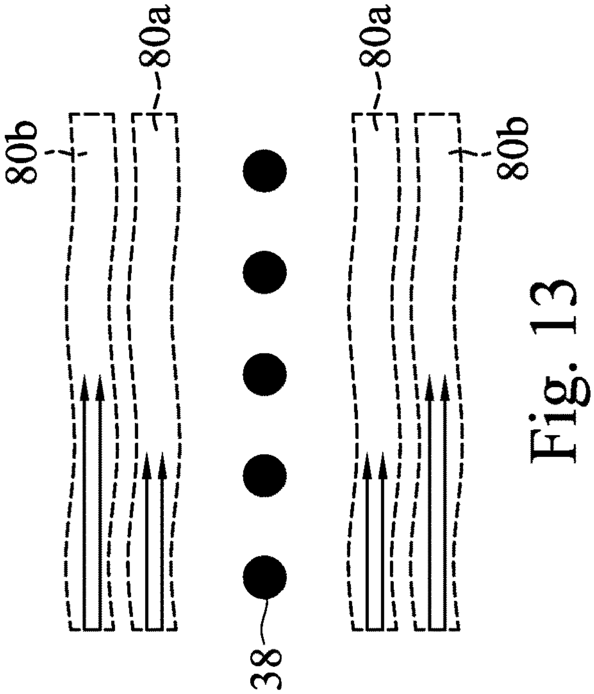
FIG. 13 illustrates dual gas shields formed from a gas injection tube having two cavities.

In some embodiments, for example when each cavity has similar sizing characteristics, each cavity may be coupled to individualized pressure regulators 64 to individually regulate the pressure of the gas to a separate mass flow meter or mass flow controller 66. In some embodiments, the flow of one gas shield may be faster or slower than the other gas shield. In some embodiments, the flow of the gas shields may the same or similar. As depicted in FIG. 13, for example, the longer arrows in gas shield **80*b* indicate that gas shield 80*b* has greater flow than the gas shield 80*a***.

Figure 11:
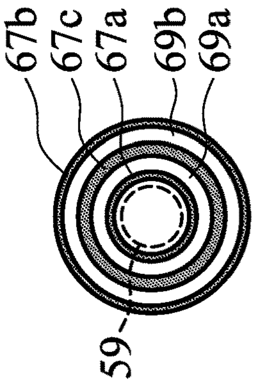
FIG. 11 illustrates a cross-section of a gas injection tube having a double cavity, in accordance with some embodiments.

FIG. 11 illustrates a cross-section of gas injection tube 68 having a double cavity, in accordance with some embodiments. The cross-section view FIG. 11 illustrates that the multiple cavities may be arranged concentrically. For example, the first cavity **69*a* is concentric with the second cavity 69*b*. In some embodiments, however, the multiple cavities may be arranged non-concentrically, with each cavity having its own shape. The first cavity 69***a* is between inner wall 67*a* and middle wall 67*c*. The second cavity 69*b* is between middle wall 67*c* and outer wall 67*b*. Nozzle-shroud 59 is shown in phantom, which may or may not be in the cross-section, and is illustrated for context.

Figure 12:
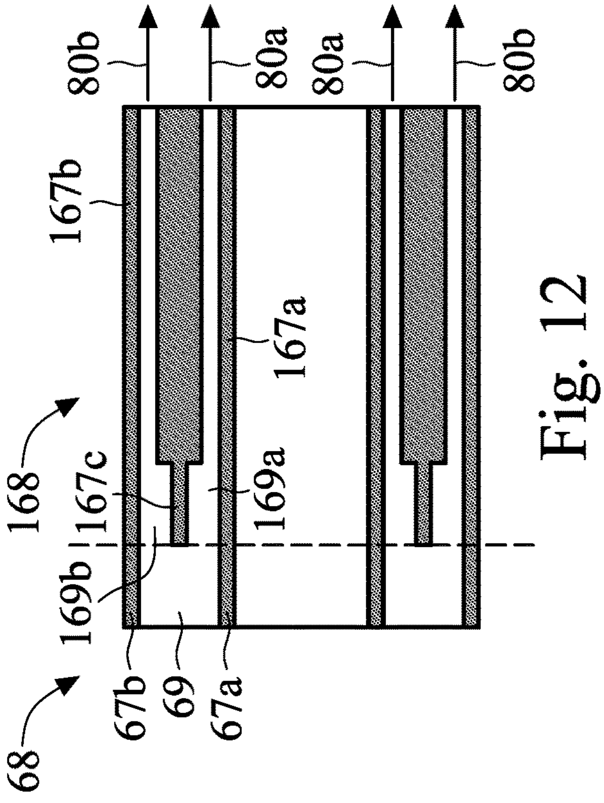
FIG. 12 illustrates a longitudinal cross-section of a gas injection head having a double cavity, in accordance with some embodiments.

Referring now to FIG. 12, gas injection tube 68 may include a gas injection head 168 abutting the outlet of gas injection tube 68. Gas injection head 168 includes multiple cavities, such as cavities 169*a* and 169*b*. The airflow restriction within the cavities 169*a* and 169*b* of gas injection head 168 may vary within the head to force the gas 80*a* and 80*b* out of gas injection head 168 with an accelerated flow. The design of the cavities 169*a* and 169*b* and restrictions can cause different flow rates for each layer of the gas shield using a single mass flow meter or mass flow controller 66 (e.g., see FIG. 5). In some embodiments, gas injection head 168 may be an integrated portion of gas injection tube 68, while in some embodiments, gas injection head 168 may be removable and replaceable, separate from the rest of gas injection tube 68. The cross-section of the injection head of FIG. 12 may be similar to that described above with respect to FIG. 11.

It should be understood that the vacuum exhaust tube 78 of the vacuum exhaust system 70 may have a similar shape and size as those discussed above with respect to FIGS. 10 through 12. A multiple cavity gas injection tube, e.g., gas injection tube 68 of FIG. 10 or gas injection head 168 of FIG. 12, may also be used with a vacuum exhaust tube 78 having a different number of cavities. If vacuum exhaust tube 78 has fewer cavities, the gas shields 80*a* and 80*b* may collapse into fewer gas shields closer to the inlet of vacuum exhaust tube 78. If vacuum exhaust tube 78 has more cavities than the corresponding gas injection tube, the gas shields 80*a* and 80*b* may expand to form additional gas shields closer to the inlet of the vacuum exhaust tube 78.

Referring now to FIG. 13, FIG. 13 illustrates dual gas shield 80*a* and 80*b* formed from a gas injection tube having two cavities, such as discussed above with respect to FIGS. 10 and 12. An inner gas shield 80*a* is shown which results from the double cavities of gas injection tube 68 of FIG. 10 or from double cavities of the gas injection head 168 of FIG. 12. An outer gas shield 80*b* is also shown. Although two gas shields are shown, it should be understood that other numbers of gas shields may be present.

Figure 14:
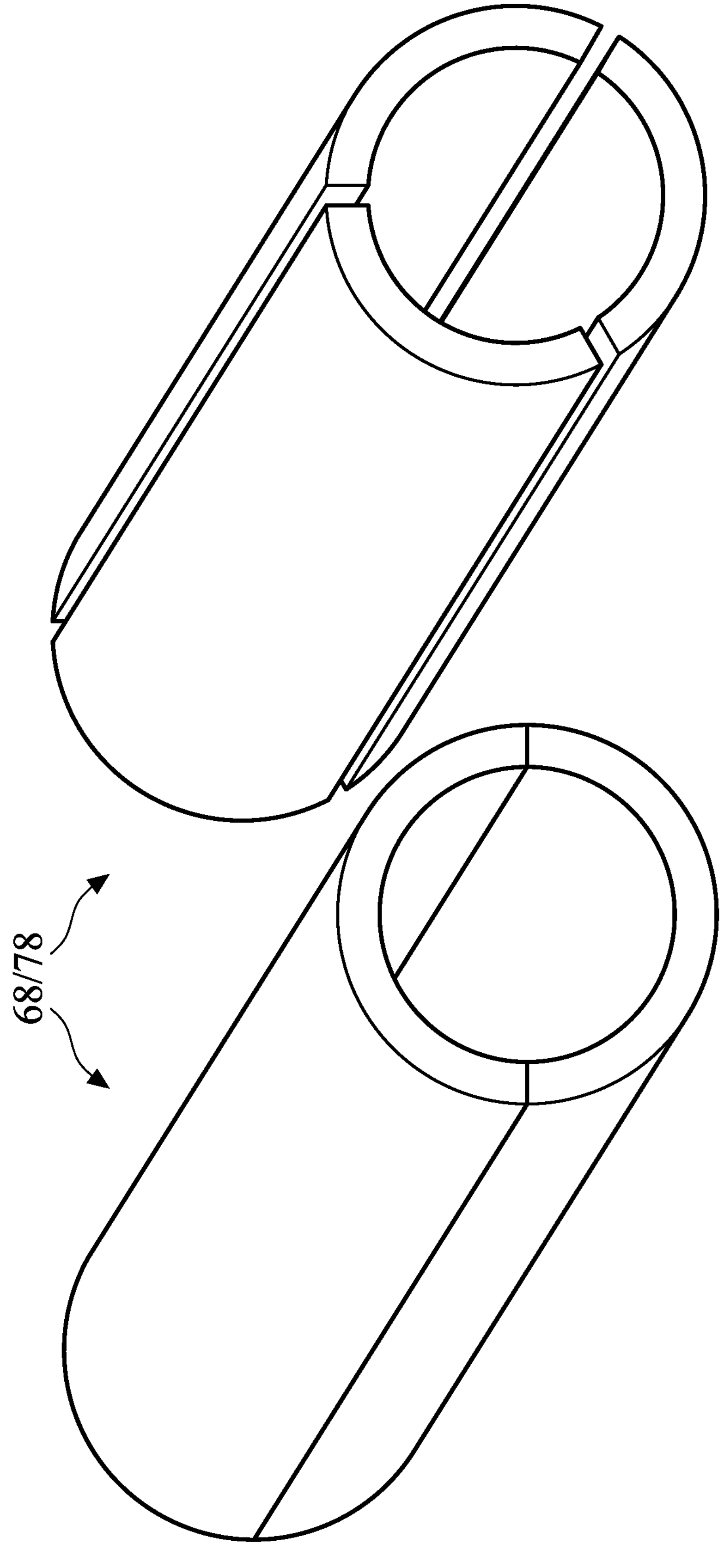
FIG. 14 illustrates multi-segmented tubes, in accordance with some embodiments.

Referring now to FIG. 14, multi-segmented tubes are illustrated, in accordance with some embodiments. Gas injection tube 68 and/or vacuum exhaust tube 78 may be made up of individual longitudinal segments, such as illustrated in perspective view in FIG. 14. In the left hand side tube of FIG. 14, two segments are shown with the two segments abutting one another. In the right hand side tube of FIG. 14, three segments are shown with the three segments having gaps between the segments. Other numbers of segments may be used with or without gaps between the segments. Gaps may be possible in the segments with the gas shield 80 expanding to fill in the gaps as the gas shield 80 travels from gas injection tube 68 to vacuum exhaust tube 78. In some embodiments, gaps in the gas shield 80 may be permissible, and the gas shield may be configured to primarily protect collector 36 and lower cone 50.

Figure 15:
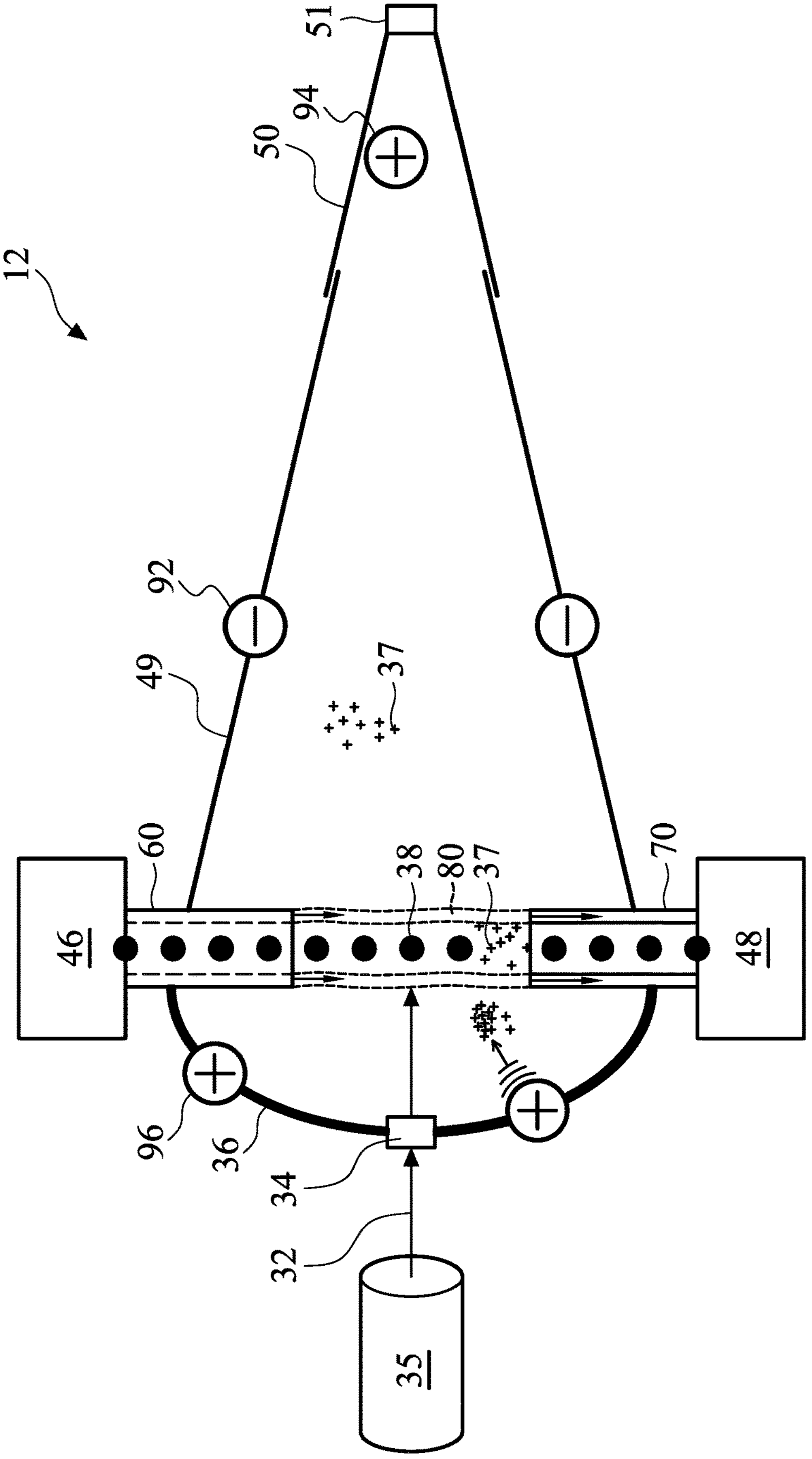
FIG. 15 illustrates an EUV source which includes a charge bias to a collector, vanes, and a lower cone.

Referring now to FIG. 15, an EUV source is illustrated which includes a charge bias to collector 36, vanes 49, and lower cone 50. In some embodiments, charges may be used on different components of EUV source 12 to direct contamination resulting from producing the LPP and EUV radiation. In addition to or instead of gas shield 80, in some embodiments, a positive or negative charge bias can be directly placed on the components of EUV source 12. When the droplets are vaporized in the process of creating EUV radiation and LPP, positive ions are formed from the droplet material. For example, in the case where the droplets are made of tin, Sn+ ions are formed. The vaporized material ions are generally homogeneously distributed, as discussed above.

The material ions may, however, be opposed or attracted by a charged body. Because like polarity opposes like polarity, a positive bias on collector 36 and lower cone 50 will prevent or reduce positive material ions from forming on these positively charged bodies. On the other hand, because opposite polarity attracts opposite polarity, a negative bias on vanes 49 will attract positive material ions to vanes 49 where the material ions can be collected and be recovered.

Still referring to FIG. 15, a negative bias voltage 92 may be applied to vanes 49 during EUV radiation production. Negative bias voltage 92 may be between about −1 V and −10 kV, such as about −1 kV. Other voltages may be used. A positive bias voltage 96 may be applied to collector 36 during EUV radiation production. Positive bias voltage 96 may be between about 1 V and 10 kV, such as about 1 kV. A positive bias voltage 94 may be applied to lower cone 50 during EUV radiation production. Positive bias voltage 94 may be between about 1 V and 10 kV, such as about 1 kV. The bias voltages 92, 94, and 96 may have a same magnitude or different magnitudes.

Some embodiments may include gas injection system 60 and vacuum exhaust system 70 in addition to the component biasing. Where positive material ions escape gas shield 80, the charged EUV source 12 components can attract or repel the ions to prevent collector 36 and lower cone 50 contamination by vaporized droplets.

Some embodiments may include gas injection system 60 and vacuum exhaust system 70 but not the component biasing. Yet other embodiments may include the component biasing, but not gas injection system 60 nor vacuum exhaust system 70. Embodiments may use component biasing and the combined gas injection system 60 and vacuum exhaust system 70 in addition to other contamination mediation remedies which deal with contamination of collector 36 or other EUV source 12 components.

Figure 16:
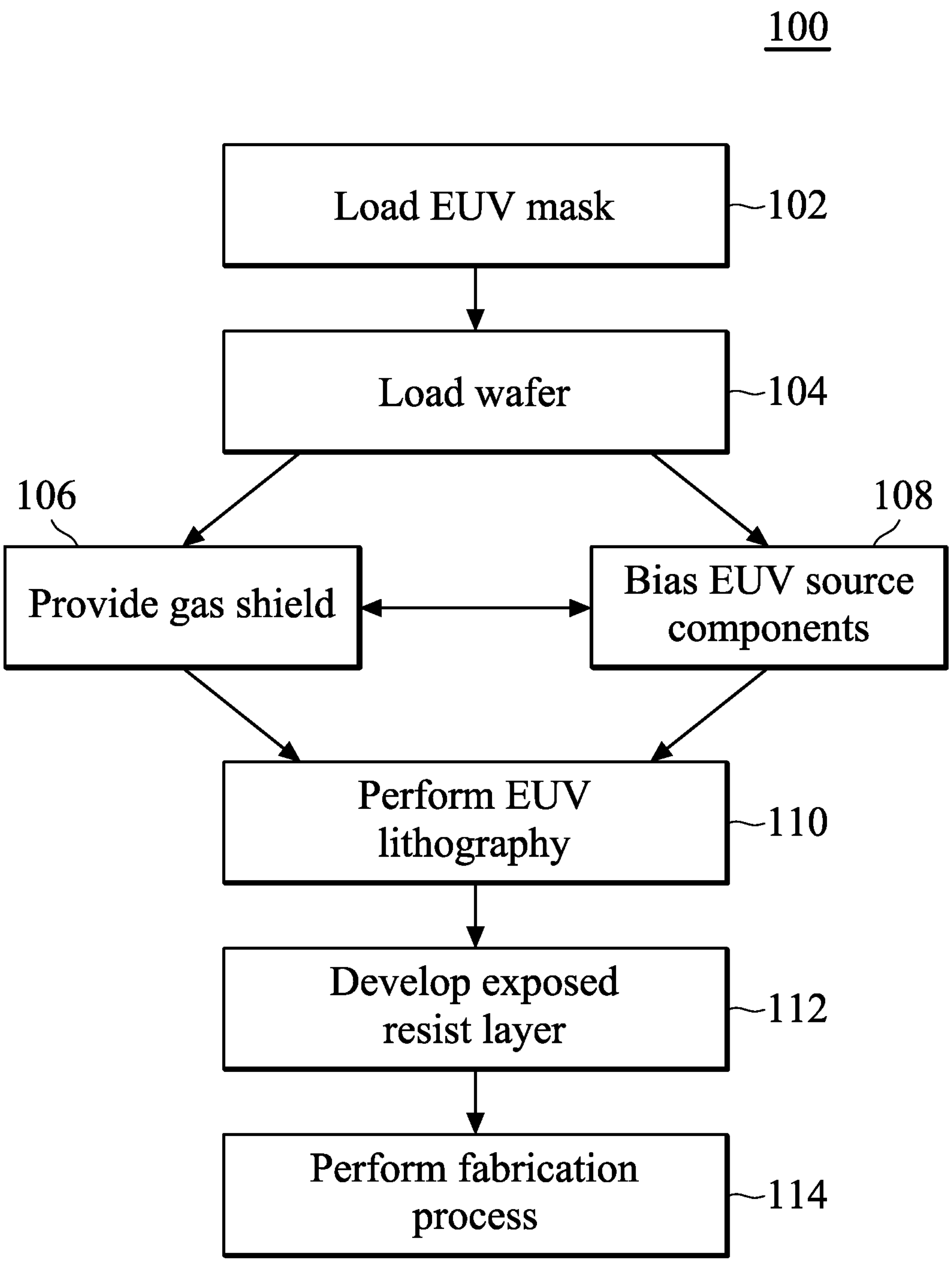
FIG. 16 is a flow diagram of a method for an EUV lithography process implemented by the lithography system, in accordance with some embodiments.

FIG. 16 is a flow diagram of a method 100 for an EUV lithography process implemented by the lithography system 8 (see FIG. 1), in accordance with some embodiments.

At step 102, method 100 loads an EUV mask, such as mask 18, to the lithography system 8 that is operable to perform an EUV lithography exposing process. Mask 18 includes an IC pattern to be transferred to a semiconductor substrate, such as the wafer 22. Step 102 may further include various steps, such as securing mask 18 on the mask stage 16 and performing an alignment.

At step 104, method 100 loads the wafer 22 to the lithography system 8. The wafer 22 is coated with a resist layer. In the present embodiment, the resist layer is sensitive to the EUV light 41 from the EUV source 12 of the lithography system 8.

Flow of method 100 continues to step 106 or step 108. Following step 106 or 108, flow may continue to step 110 or may proceed to the other of step 108 or step 106 and then continue to step 110.

At step 106, gas is provided to the EUV source, such as EUV source 12, of the lithography system 8, thereby providing a gas shield, such as gas shield 80, around a stream of droplets, such as droplets 38, extending from a gas injection system, such as gas injection system 60, to an vacuum exhaust system, such as vacuum exhaust system 70. Flow rate of the gas shield are also controlled.

At step 108, various components of EUV source 12 may be voltage biased. For example, a lower cone and collector, such as respective lower cone 50 and collector 36, may be biased with a positive voltage. Vanes, such as vanes 49, of the EUV source 12 may be voltage biased with a negative voltage.

At step 110, a lithography process is performed, exposing the wafer 22 in the lithography system 8. A high intensity laser, such as $CO_2$ laser system 35, is enabled as well as a droplet generator, such as droplet generator 46. The laser is pulsed synchronously with the droplets generated by droplet generator 46 through a suitable mechanism, such as a control circuit with timer to control and synchronize the laser system 35 with droplet generator 46. EUV radiation is generated by vaporization of droplets 38, producing EUV radiation and positive ions.

In embodiments using step 106, gas shield 80 reduces the dispersion of the positive ions by keeping some or all of the positive ions within gas shield 80, and conveying the positive ions to a droplet catcher or vacuum exhaust system 70. In embodiments using step 108, the biased components of EUV source 12 reduces the dispersion of the positive ions by attracting positive ions to negatively charged components and opposing positive ions from positively charged components. In embodiments using both steps 106 and 108, the dispersion of positive ions is further reduced by having both mechanisms (gas shield and biased source components) in operation.

EUV radiation is dispersed in the source vessel of EUV source 12, collected by collector 36, and conveyed to IF module 51 as EUV light. EUV light is passed to scanner 10 and illuminated on the mask 18 (by the illuminator 14), and is further projected on the resist layer coated on the wafer 22 (by the POB 20), thereby forming a latent image on the resist layer.

Method 100 may include other operations to complete the lithography process. For example, method 100 may include a step 112 by developing the exposed resist layer to form a resist pattern having a plurality of openings defined thereon. Particularly, after the lithography exposing process at step 110, the wafer 22 is transferred out of the lithography system 8 to a developing unit to perform a developing process to the resist layer. Method 100 may further include other operations, such as various baking steps. As one example, method 100 may include a post-exposure baking (PEB) step between steps 110 and 112.

Method 100 may further include other operations, such as a step 114 to perform a fabrication process to the wafer through the openings of the resist pattern. In one example, the fabrication process includes an etch process to the wafer using the resist pattern as an etch mask. In another example, the fabrication process includes an ion implantation process to the wafer using the resist pattern as an implantation mask.

An EUV source is disclosed which generates EUV radiation through laser-produced plasma. The EUV source includes a collector integrated with a gas mechanism to provide a gas shield and/or component biasing. The gas shield forms a shield around a vaporization reaction, thereby preventing ionized particles from dispersing throughout the source vessel. Component biasing repels or attracts ionized particles according to the component biasing, thereby preventing ionized particles from dispersing throughout the source vessel. The gas shield and/or component biasing reduces contamination of the collector component of the EUV source. Various operations including controlling the gas flow rates may optimize the protection effectiveness of the gas shield. The present disclosure also provides an EUV lithography system with the EUV source and a method using the same. By utilizing the disclosed EUV source with a gas shield and/or component biasing, the EUV lithography system and the corresponding method, the contamination to the collector is reduced and the lifetime of the collector is increased.

One embodiment is a method including producing a droplet stream from a droplet generator in an extreme ultra-violet (EUV) source device, where the droplet stream includes a first material. A gas shield is provided around the droplet stream. While the gas shield is provided, a laser is pulsed to vaporize a droplet from the droplet stream to produce EUV radiation and particles of the first material, where the particles of the first material are directed to a droplet catcher by the gas shield.

Another embodiment is a method including producing a stream of first material droplets from a droplet generator in an extreme ultra-violet (EUV) source device. A collector of the EUV source device is biased with a positive voltage. Vanes of the EUV source device are biased with a negative voltage. A droplet of the stream of first material droplets is vaporized to produce EUV radiation and positively charged particles of the first material, where the biased collector repels a first plurality of the particles of the first material from the collector, and where the biased vanes attracts the first plurality of the particles of the first material to adhere to the vanes.

Another embodiment is an apparatus including an extreme ultra-violet (EUV) source device. The EUV source device includes a droplet generator, a droplet catcher, a collector, a gas injection system, and a vacuum exhaust system. The gas injection system includes a gas injection tube disposed around a shroud of the droplet generator such that a stream of droplets generated by the droplet generator passes through the gas injection tube. The vacuum exhaust system includes a vacuum exhaust tube disposed around an inlet of the droplet catcher such that the stream of droplets generated by the droplet generator passes through the vacuum exhaust tube.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

producing a droplet stream from a droplet generator in an extreme ultra-violet (EUV) source device, the droplet stream comprising a first material;

providing a gas to a gas injection head disposed around an outlet of the droplet generator, the droplet stream passing through the gas injection head, the gas injection head funneling the gas from a first cavity having a first width to a head outlet, the head outlet surrounding the droplet stream, the head outlet having a second width narrower than the first width;

providing a first gas shield surrounding the droplet stream from the head outlet;

providing a second gas shield surrounding the droplet stream from the head outlet, the first gas shield being inset the second gas shield; and while providing the first gas shield and the second gas shield, pulsing a laser to vaporize a droplet from the droplet stream to produce EUV radiation and particles of the first material, wherein the particles of the first material are directed to a droplet catcher by the first gas shield and the second gas shield.

2. The method of claim 1, wherein the first material is tin.

3. The method of claim 1, wherein the particles of the first material are positively charged ions of the first material.

4. The method of claim 3, further comprising:

biasing a collector of the EUV source device with a positive voltage to repel a second plurality of the particles of the first material from the collector; and biasing vanes of the EUV source device with a negative voltage to attract the second plurality of the particles of the first material to adhere to the vanes.

5. The method of claim 1, wherein the gas shield comprises $H_2$, He, Ar, $N_2$, $O_2$, $N_2O$, clean dry air (CDA), ambient air, or combinations thereof.

6. The method of claim 1, further comprising:

controlling a flow of the first gas shield and the second gas shield so that a vacuum is maintained within the EUV source device.

7. The method of claim 1, wherein the first gas shield and the second gas shield are provided by a gas injection tube disposed around a nozzle of the droplet generator, wherein the droplet stream passes through the gas injection tube.

8. The method of claim 7, further comprising:

heating the gas injection tube to a temperature between 50° C. and 450° C.

9. The method of claim 7, wherein a cross section of the gas injection tube has a shape of a circle, ellipse, or polygon.

10. The method of claim 7, wherein the gas injection tube comprises multiple cavities, wherein the first gas shield is provided from a first cavity of the multiple cavities of the gas injection tube, and wherein the second gas shield is provided from a second cavity of the multiple cavities of the gas injection tube.

11. An apparatus, comprising:

an extreme ultra-violet (EUV) source device, comprising:

a droplet generator, a droplet catcher, a gas injection system, and a vacuum exhaust system, wherein the gas injection system comprises a gas injection tube disposed around an outlet of the droplet generator such that a stream of droplets generated by the droplet generator passes lengthwise through the gas injection tube, the gas injection tube including a first gas outlet and a second gas outlet, the first gas outlet being inset in the second gas outlet, and wherein the vacuum exhaust system comprises a vacuum exhaust tube disposed around an inlet of the droplet catcher such that the stream of droplets generated by the droplet generator passes through the vacuum exhaust tube.

12. The apparatus of claim 11, wherein the EUV source device further comprises:

a collector, wherein the collector is configured to receive a first bias voltage; and vanes, wherein the vanes are configured to receive a second bias voltage.

13. The apparatus of claim 11, wherein the gas injection system is configured to provide a gas shield flowing from the gas injection system to the vacuum exhaust system, wherein the gas shield comprises $H_2$, He, Ar, $N_2$, $O_2$, $N_2O$, clean dry air (CDA), ambient air, or combinations thereof.

14. The apparatus of claim 11, wherein the gas injection tube comprises multiple lengthwise sections.

15. The apparatus of claim 11, wherein the gas injection tube has a cross-section shape of a circle, ellipse, or polygon.

16. A method, comprising:

producing a droplet stream from a droplet generator, the droplet stream comprising droplets of a first material;

injecting gas around an outlet of the droplet generator from a first outlet of a gas injection tube to produce a first gas shield around the droplet stream, the first gas shield having a first flow rate;

injecting gas around the first gas shield from a second outlet of the gas injection tube to produce a second gas shield, the second gas shield having a second flow rate different than the first flow rate;

suctioning the first gas shield at an inlet of a suctioning tube, the inlet of the suctioning tube being disposed to surround an inlet of a droplet catcher;

vaporizing a droplet from the droplet stream by a laser to produce light and particles of the first material;

confining the particles of the first material within the second gas shield; and directing the particles of the first material to a droplet catcher.

17. The method of claim 16, wherein the first material is tin.

18. The method of claim 16, wherein the gas shield comprises $H_2$, He, Ar, $N_2$, $O_2$, $N_2O$, clean dry air (CDA), ambient air, or combinations thereof.

19. The method of claim 16, further comprising:

collecting the light and directing it to a lithography apparatus.

20. The method of claim 16, wherein the gas injection tube comprises multiple lengthwise sections.

* * * * *